United States Patent
Mäkipää et al.

(10) Patent No.: US 10,013,295 B2
(45) Date of Patent: Jul. 3, 2018

(54) CONTROL MECHANISM BASED ON TIMING INFORMATION

(71) Applicants: Aalto University Foundation, Espoo (FI); Teknologian tutkimuskeskus VTT, Espoo (FI)

(72) Inventors: Jani Mäkipää, Espoo (FI); Lauri Koskinen, Espoo (FI); Matthew Turnquist, Vantaa (FI); Markus Hiienkari, Helsinki (FI)

(73) Assignee: MINIMA PROCESSOR OY, Oulu (FI)

( * ) Notice: Subject to any disclaimer, the term of this patent is extended or adjusted under 35 U.S.C. 154(b) by 27 days.

(21) Appl. No.: 14/899,548

(22) PCT Filed: Jun. 17, 2014

(86) PCT No.: PCT/EP2014/062667
§ 371 (c)(1),
(2) Date: Dec. 17, 2015

(87) PCT Pub. No.: WO2014/202576
PCT Pub. Date: Dec. 24, 2014

(65) Prior Publication Data
US 2016/0147588 A1 May 26, 2016

(30) Foreign Application Priority Data
Jun. 18, 2013 (DE) .................. 10 2013 211 372

(51) Int. Cl.
*G06F 11/00* (2006.01)
*G06F 11/07* (2006.01)
(Continued)

(52) U.S. Cl.
CPC ............ *G06F 11/0757* (2013.01); *G06F 1/12* (2013.01); *G06F 1/14* (2013.01); *G06F 11/0721* (2013.01); *H03K 5/13* (2013.01)

(58) Field of Classification Search
CPC ............ G06F 11/0757; G06F 11/0721; G06F 11/076; G06F 11/0754; G06F 11/2236;
(Continued)

(56) References Cited

U.S. PATENT DOCUMENTS 6,751,282 B1 * 6/2004 Kramer .................. G06F 7/62
377/15
7,671,627 B1 3/2010 Somani et al.
(Continued)

FOREIGN PATENT DOCUMENTS

WO   WO 2014200430 A1   12/2014

OTHER PUBLICATIONS

Chae, Kwanyeob et al., "Timing Error Prevention Using Elastic Clocking", IC Design & Technology, 2011 IEEE International Conference, May 2-4, 2011, pp. 1-4.
(Continued)

*Primary Examiner* — Marc Duncan
(74) *Attorney, Agent, or Firm* — TIPS Group

(57) ABSTRACT

There is provided an apparatus comprising thresholding means adapted to check if an average frequency of occurrence of timing violations is outside a range; and controlling means adapted to control at least one of a clock frequency, a processing, a heat generation, a bias voltage, a current, and a temperature in a direction to bring the average frequency of occurrence of timing violations into the range if the average frequency of occurrence of timing violations is outside the range.

8 Claims, 3 Drawing Sheets

(51) Int. Cl.
*G06F 1/14* (2006.01)
*G06F 1/12* (2006.01)
*H03K 5/13* (2014.01)

(58) Field of Classification Search
CPC .... G06F 11/2226; G06F 11/3024; G06F 1/08; G06F 1/12; G06F 1/14; H03K 5/13
See application file for complete search history.

(56) References Cited

U.S. PATENT DOCUMENTS

| | | | |
|---|---|---|---|
| 7,702,966 B2 * | 4/2010 | Chandwani | G06F 11/008 714/47.1 |
| 7,971,105 B2 | 6/2011 | Rozen et al. | |
| 8,156,382 B1 * | 4/2012 | Booth | G06F 11/0727 714/42 |
| 8,381,009 B2 | 2/2013 | Priel et al. | |
| 8,874,978 B2 | 10/2014 | Hirairi | |
| 9,047,184 B2 * | 6/2015 | Bull | G06F 11/0721 |
| 9,158,356 B2 | 10/2015 | Wu et al. | |
| 2006/0123252 A1 * | 6/2006 | Vaidya | G06F 1/3228 713/300 |
| 2008/0036487 A1 * | 2/2008 | Bradley | G01R 31/31708 324/750.3 |
| 2008/0104561 A1 * | 5/2008 | Carpenter | G06F 17/5036 716/104 |
| 2009/0052608 A1 * | 2/2009 | Attinella | G06F 11/348 377/15 |
| 2013/0007516 A1 * | 1/2013 | Wu | G06F 11/076 714/15 |
| 2013/0300463 A1 * | 11/2013 | Gemmeke | G06F 1/324 327/113 |
| 2015/0178145 A1 | 6/2015 | Chakraborty et al. | |

OTHER PUBLICATIONS

Das, Shidhatha et al., "A Self-Tuning DVS Processor Using Delay-Error Detection and Correction", IEEE Journal of Sold-State Circuits, vol. 41, No. 4, Apr. 2006, pp. 792-804.

* cited by examiner

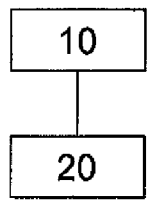
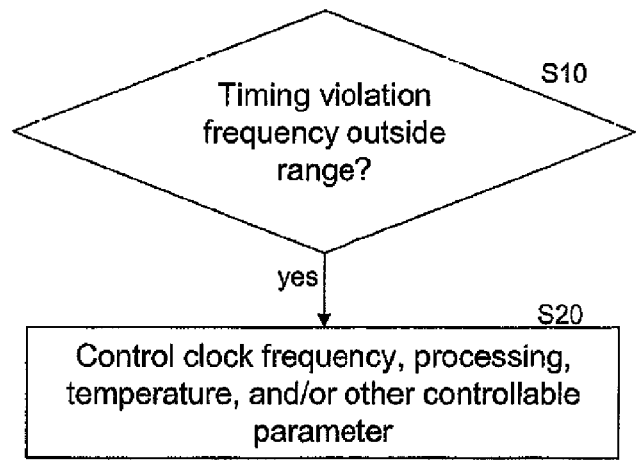
Fig. 3                                  Fig. 4
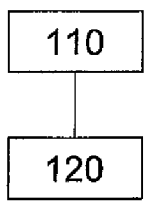
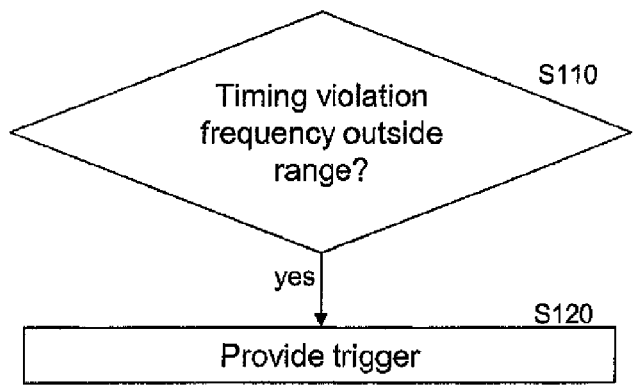
Fig. 5                                  Fig. 6

CONTROL MECHANISM BASED ON TIMING INFORMATION

FIELD OF THE INVENTION

The present invention relates to an apparatus, a method, a system, and a computer program product related to timing of a pipelined digital logic. More particularly, the invention provides a mechanism to adaptively control the operating parameters (e.g. clock frequency, processes, and/or temperature) based on cycle-by-cycle timing information of the pipelined digital logic.

BACKGROUND OF THE INVENTION

Abbreviations

CLK Clock
DC Direct Current
EDS Error Detecting Sequential Circuits
FW Firmware
HW Hardware
IRQ Interrupt Request
LUT Lookup table
OS Operating System
PVT Power, Voltage, Temperature
SW Software
TB Time Borrowing
TED Timing Error Detection
TEP Timing Error Prevention In today's digital logic systems, it is tried to increase the operation frequency while at the same time reducing the power consumption. In such systems, timing violations (including timing errors) may occur due to e.g. (local) voltage drops, temperature variations, variations in gate lengths, doping concentration variations of transistors and other semiconductor elements, cross-coupling noise etc. Also, different manufacturing process global and local corners in different parts of a digital logic circuit may lead to timing violations. Typically, the boundary conditions for a correct timing are referred to as PVT. In order to avoid timing violations, typically timing margins are applied. If they are selected to fit extreme PVT conditions (corners of PVT cube), the timing margins may result in a slower than necessary performance of the digital logic. Timing margins may also lead to increased energy consumption and/or a raise in semiconductor (e.g silicon, germanium, III-V semiconductor) area.

In the present application, as a timing violation, the following behavior is understood (see FIG. 1):

The digital logic (also named logic circuit) comprises one or more combinational logics such as $f_A$ and $f_B$ in FIG. 1. The combinational logics store the result of their calculation in a respective (1-bit) register such as register A, register B. The registers may be latches or flip-flops or a mixture of both of them. They work (are clocked) according to a clock CLK. In the figures, dashed arrows indicate clocking. A flip-flop is transparent for data input at a (rising or falling) edge of the clock. A latch is transparent for data input if the clock has a predefined state (high or low).

If the digital logic works correctly, combinational logic $f_A$ works on input signal X to obtain $f_A(X)$. If register A is transparent for data input at a first cycle of the clock (either at an edge or at a certain level of the clock depending on whether the register is a flip-flop or a latch, respectively), it stores $f_A(X)$. If there are subsequent combinational logics and registers, as e.g. $f_B$ and register B shown in FIG. 1, combinational logic $f_B$ will operate on $f_A(X)$, obtaining $f_B(f_A(X))$. This result is stored in register B at a second cycle of the clock when the register B is transparent for data input.

However, if combinational logic A has not finished its operation when register A becomes transparent for data input, register A will not store $f_A(X)$. This is named a timing violation. If the output of register A is different from $f_A(X)$, the timing violation results in a timing error. Accordingly, combinational logic works on a "wrong" input, such that it does not obtain $f_B(f_A(X))$.

If register B is a latch, and combinational logic B is too fast, another timing violation may occur, sometimes also named "false timing violation". Namely, if combinational logic B has finished its operation on $f_A(X)$ while the clock is still in the predefined state where register B is open for data input, register B will store $f_B(f_A(X))$ immediately after combinational logic B has finished its operation (i.e. during the first cycle of the clock) instead of at the second cycle of the clock.

Timing violations may be detected by TED. E.g., a following method of timing violation detection is known:

In parallel to a main latch such as latch A of the example above, a slow register A' is implemented which is clocked with a fixed delay relative to the main register A. The output of combinational logic $f_A$ is fed into register A', too. The output of these two registers A and A' is compared after the data input time of register A'. If the outputs are the same, there was no timing violation. However, if the input is changed during the fixed delay (because combinational logic A was too slow or too fast for register A), the outputs of the two registers A and A' are different from each other. Hence, the comparison of the outputs shows that a timing violation occurred. In this case, the timing violation must not exceed the fixed delay.

Other known error detection methods which may be used to detect a timing error are e.g.
  N+M redundancy (an argument could be made that TED is latch level N+M);
  Information redundancy techniques (Hamming and Hsiao codes); and
  Algorithmic techniques (parity check, cyclic redundancy check).

If a timing violation occurs, it may be corrected e.g. by a mechanism to re-execute, since some registers may have corrupted data due to the timing violations.

Another way to overcome timing violations for slow combinational logics is time borrowing (TB). In time borrowing, e.g. described in K. Chae, C. H. Lee, and S. Mukhopadhyay, "Timing error prevention using elastic clocking", IEEE, 978-1-4244-9021-9 (2011), a cycle in which a timing violation is detected in one combinational logic (e.g. $f_A$) may borrow time from the subsequent cycle for the subsequent combinational logic (e.g. $f_B$). If combinational logic B is fast enough, the delay of its input is compensated and the timing violation is overcome.

However, if combinational logic B is not fast enough, the timing violation (the delay time of the signal) may propagate such that another timing violation may occur in the next state. The timing violations may even accumulate in subsequent cycles leading finally to a destructive error. In order to mitigate such accumulation, Chae et al also describe clock stretching. According to clock stretching, if a timing violation is detected, the same is mitigated by time borrowing, wherein additionally to time borrowing the clock is retarded. E.g., the clock cycle from which time is borrowed is extended by a positive phase shift such as $\pi/2$ or even $\pi$. Thus, the clock cycle from which time is borrowed regains time from the stretched clock. If the borrowing and stretching are appropriately matched to each other, accumulation may be avoided. Time stretching may be considered as slow logic stepping into the execution time window.

If a timing violation is detected at every cycle in this scenario, and each cycle is extended e.g. by a phase shift of $\pi/2$ (delay of 25%), the overall operation frequency of the system is reduced from $1/T$ to $1/(T+T/4)$, where T is the clock period, i.e. by 20%. If each cycle is extended e.g. by a phase shift of $\pi$ (delay of 50%), the overall operation frequency of the system is reduced from $1/T$ to $1/(T+T/2)$, i.e. by 33%.

P. N. Whatmough, S. Das, and D. M. Bull describe in "A low power 1 GHz Razor FIR Accelerator with time-borrow tracking pipeline and approximate error correction in 65 nm CMOS", IEEE International Solid-State Circuits Conference, pages 428-430 (2013), TB tracking. In TB tracking, it is tracked if a timing violation can be successfully resolved in the subsequent combinational logic in the subsequent clock cycle. If timing violations are not resolved in a subsequent step, the supply voltage is adapted accordingly. The circuit according to Whatmough et al. provides interpolation based approximate error correction. Therefore, continuous signals are required.

Razor systems reduce the energy consumption required due to timing margins. That is, if too many timing violations are detected, the supply voltage is increased, while, if no (or hardly any) timing violations are detected, the supply voltage is reduced.

SUMMARY OF THE INVENTION

It is an object of the present invention to improve the prior art. In particular, it is an object to adapt time margins such that a stable operation of the logical circuit is achieved. Stable operation means that the average timing violation frequency is within a certain range. For example, it may mean that the timing violation frequency is below an upper threshold, but in some case, it may mean that the average timing violation frequency is above a lower threshold, or a combination of these two conditions.

According to a first aspect of the invention, there is provided an apparatus comprising thresholding means adapted to check if an average frequency of occurrence of timing violations is outside a range; and controlling means adapted to control at least one of a clock frequency, a processing, a heat generation, a bias voltage, a current, and a temperature in a direction to bring the average frequency of occurrence of timing violations into the range if the average frequency of occurrence of timing violations is outside the range.

According to a second aspect of the invention, there is provided an apparatus comprising thresholding means adapted to check if an average frequency of occurrence of timing violations is outside a range; and triggering means adapted to provide a trigger if the average frequency of occurrence of timing violations is outside the range.

According to a third aspect of the invention, there is provided an apparatus comprising monitoring means adapted to monitor if a trigger is received, wherein the trigger indicates that an average frequency of occurrence of timing violations is outside a range; and controlling means adapted to control, if the trigger is received, at least one of a clock frequency, a processing, a heat generation, a bias voltage, a current, and a temperature in a direction to bring the average frequency of occurrence of timing violations into the range.

According to a fourth aspect of the invention, there is provided a system comprising the thresholding apparatus according to the second aspect; and the controlling apparatus according to the third aspect; wherein the trigger received by the monitoring means of the controlling apparatus comprises the trigger provided by the triggering means of the thresholding apparatus.

According to a fifth aspect of the invention, there is provided a method comprising checking if an average frequency of occurrence of timing violations is outside a range; and controlling at least one of a clock frequency, a processing, a heat generation, a bias voltage, a current, and a temperature in a direction to bring the average frequency of occurrence of timing violations into the range if the average frequency of occurrence of timing violations is outside the range.

According to a sixth aspect of the invention, there is provided a method comprising checking if an average frequency of occurrence of timing violations is outside a range; and providing a trigger if the average frequency of occurrence of timing violations is outside the range.

According to a seventh aspect of the invention, there is provided a method comprising monitoring if a trigger is received, wherein the trigger indicates that an average frequency of occurrence of timing violations is outside a range; and controlling, if the trigger is received, at least one of a clock frequency, a processing, a heat generation, a bias voltage, a current, and a temperature in a direction to bring the average frequency of occurrence of timing violations into the range.

According to an eight aspect of the invention, there is provided a computer program product comprising a set of instructions which, when executed on an apparatus, is configured to cause the apparatus to carry out the method according to any one of fifth to seventh aspects.

According to some embodiments of the invention, at least one of the following advantages is achieved:
time margins are reduced;
control of PVT conditions is simplified;
semiconductor area is saved;
energy efficiency is improved.

It is to be understood that any of the above modifications can be applied singly or in combination to the respective aspects to which they refer, unless they are explicitly stated as excluding alternatives.

BRIEF DESCRIPTION OF THE DRAWINGS

Further details, features, objects, and advantages are apparent from the following detailed description of the preferred embodiments of the present invention which is to be taken in conjunction with the appended drawings, wherein FIG. 1 sketches an exemplary logic circuit;
FIG. 3 shows an apparatus according to an embodiment of the invention;
FIG. 4 shows a method according to an embodiment of the invention;
FIG. 5 shows an apparatus according to an embodiment of the invention;
FIG. 6 shows a method according to an embodiment of the invention.

DETAILED DESCRIPTION OF CERTAIN EMBODIMENTS

Herein below, certain embodiments of the present invention are described in detail with reference to the accompanying drawings, wherein the features of the embodiments can be freely combined with each other unless otherwise described. However, it is to be expressly understood that the description of certain embodiments is given for by way of example only, and that it is by no way intended to be understood as limiting the invention to the disclosed details.

Moreover, it is to be understood that the apparatus is configured to perform the corresponding method, although in some cases only the apparatus or only the method are described.

Figure 2:
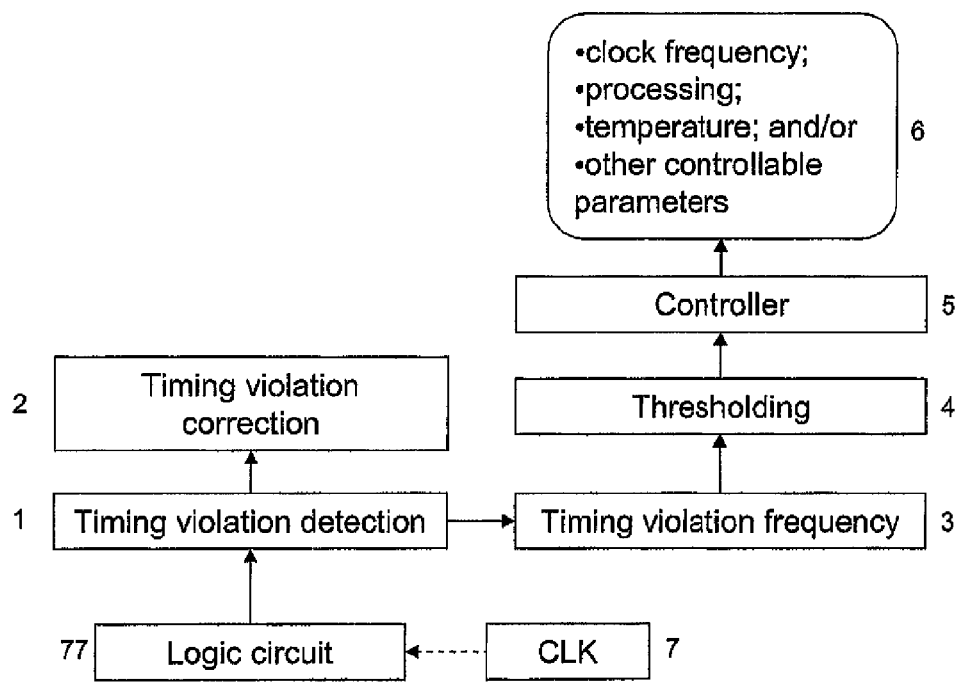
FIG. 2 shows a system according to an embodiment of the invention.

FIG. 2 shows a system according to an embodiment of the invention. The system operates on a logic circuit 77 clocked by a clock 7. The system comprises timing violation detection means 1, timing violation correction means 2, timing violation frequency obtaining means 3, thresholding means 4, controlling means 5, and at least one of a clock control unit for modifying a clock frequency, processing control unit for controlling processing of data (e.g. number of parallel processes), a heat control unit for controlling a heat generation, a bias control unit for controlling a bias voltage, a current control unit for controlling a current, and a temperature control unit for controlling (increasing or decreasing) a local temperature. The one or more of the control units are jointly represented as control units by box 6 in FIG. 2.

Figure 1:
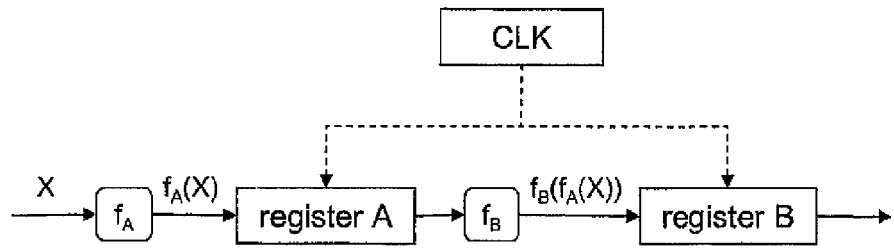

The logic circuit 77 may be an arbitrary logic circuit comprising one or more combinational logics and respective 1-bit registers storing the results of the combinational logics, such as the one shown in FIG. 1. At least a portion of the logic circuit 77 may form a logic pipeline, in which an output depends on an input signal to the logic pipeline. The registers may be latches or flip-flops or a combination thereof, which are clocked by a clock CLK 7. In some embodiments, secondary clocks controlled by CLK 7 may clock some of the registers. These registers are, hence, clocked (indirectly) by clock CLK 7, too. A combinational logic may be any kind of a logical unit such as an AND gate, a NAND gate, an OR gate, a NOR gate, a logic inverter, an adder, a half-adder, etc. The combinational logic(s) may have one or more input terminals and one or more output terminals, whereof the output terminal(s) are connected to the respective register(s). Some of the registers may be connected to an input terminal of one or more of the combinational logics.

The timing violation detection means 1 detects occurrence of a timing violation in the logic circuit, more precisely: in at least one of the combinational logics with its register clocked (directly or indirectly) by the clock 7. This may be done by any method to detect timing violations as described in the prior art. If two or more registers are clocked (directly or indirectly) by CLK 7, the timing violation detection means 1 may detect occurrence of a timing violation in some or all of the corresponding combinational logics. For this, in some embodiments, timing violation signals from the corresponding registers may be combined by logical OR.

In some embodiments, timing violations will be detected specifically for one or more combinational logics. Accordingly, an OR combination is not required for this timing violation (one combinational logic) or these timing violations (two or more combinational logics). If two or more combinational logics are specifically supervised, the apparatus may comprise a respective timing violation frequency obtaining means 3 and thresholding means 4 for each of the combinational logics with the corresponding registers, and the output signals of respective thresholding means 4 may be combined by logical OR on the input stage of the controlling means 5.

If the timing violation detection means 1 detects a violation, it sends a corresponding signal (named timing error prevention signal, TEP signal) to both the timing violation correction means 2 and the timing violation frequency obtaining means 3.

The timing violation correction means 2 corrects the timing violation by any feasible method such as time borrowing with or without time stretching, as described in the prior art section. If e.g. time stretching is applied, the timing violation correction means applies a delay to the clock CLK but does not modify the clock frequency. If a correction method such as time borrowing is applied, execution of the logic may proceed in spite of the detected timing violation.

The timing violation frequency obtaining means 3 is adapted to obtain an average frequency of occurrence of timing violations. The average is obtained over a certain period, which is one, two or more of the cycles of clock CLK, preferably ten or more of the cycles, and more preferably 100 or more of the cycles. It may even extend to a week, a month or more than a month in real time. For example, in systems used to investigate silicon ageing, the period may be several months. The period may be indicated in number of cycles or in real time values (e.g. seconds, minutes, hours, days etc.). In some embodiments, the "averaging" is over a single cycle only. Thus, in these embodiments, the timing violation frequency is 1/cycle if a timing violation occurs and 0 if a timing violation does not occur.

In some embodiments, the period over which the timing violation frequency is obtained is predefined and constant. In some embodiments, the period may be adapted. Such adapting may be based e.g. on at least one of PVT and data. For example, the system may comprise a period lookup table, where a period is indicated for each value of the at least one of PVT (or each value range of the at least one of PVT) in an operating range of the system. Also, the period LUT may show a dependency of the period on a nature of the data, e.g. a data rate or a number of instructions queued. For example, if the logic pipeline is out-of-order, instructions are queued. The LUT may indicate a period depending on the number of queued instructions and PVT. In some embodiments, a functional relationship showing the dependency of the period on the at least one of PVT is stored. In that sense, a LUT is a special kind of a functional relationship.

In embodiments with a functional relationship, the timing violation frequency obtaining means 3 checks from time to time and/or upon occurrence of a certain condition such as adaption of the at least one of PVT and data, the relevant condition (i.e. the at least one of PVT and data), applies the functional relationship accordingly (e.g. selects a corresponding period from the period LUT), and applies this period for obtaining the average frequency.

If there are different timing violation frequency obtaining means 3 specifically for different latches of the pipeline, each of the timing violation frequency obtaining means 3 may apply a different period.

The timing violation frequency obtaining means 3 may be realized by a counter which is incremented every time a TEP signal is received. The counter may be reset every time the predefined period is elapsed, or it may count over a sliding time window of duration of the predefined period.

The thresholding means 4 checks if the average frequency of occurrence of timing violations in the timing violation frequency obtaining means 3 is in a certain range. If the timing violation frequency obtaining means 3 is realized as a counter, the thresholding means 4 may compare the content of the counter with the range. The range may be defined by an upper threshold. If the content of the counter is larger than the upper threshold, the average frequency of occurrence of timing violations is outside the range. The range may be defined by a lower threshold. If the content of the counter is lower than the lower threshold, the average frequency of occurrence of timing violations is outside the range. The range may be defined by both an upper threshold and a lower threshold.

In order to avoid a strong fluctuation of the system behavior, the upper threshold is typically two or more, preferably 10 or more, and more preferably 20 or more. However, if the "averaging" is over a single clock period, the threshold is between 0 and 1/cycle.

The threshold may be adapted, too. E.g., the threshold may depend on the number of clock cycles over which the average frequency of occurrence of timing violations is obtained by the timing violation frequency obtaining means 3. In some embodiments, one may target to reduce the timing violations as much as possible. In these cases, the upper threshold may be e.g. 2% of the number of clock cycles, preferably 1% of the number of clock cycles, more preferably 0.5% of the number of clock cycles, and still more preferably 0.1% of the number of clock cycles.

In some embodiments, one may target to reduce energy consumption as much as possible. In these cases, the lower threshold may be e.g. 1% of the number of clock cycles, preferably 2% of the number of clock cycles, and more preferably 5% of the number of clock cycles.

In some embodiments, a balance of reduction of timing violation and energy consumption may be targeted. Hence, both an upper threshold and a lower threshold may be applied, wherein the upper threshold is larger than the lower threshold.

If only one of the upper and lower thresholds is given, the other one may be considered as 0% and 100%, respectively.

In some embodiments, the threshold is predefined and constant or depends on the period over which the average frequency is obtained only. In some embodiments, the threshold may be additionally adapted dependent on PVT or data in a similar way as described with respect to the period. For example, the system may comprise a threshold lookup table, where a threshold is indicated for each PVT (or ranges of PVT) in an operating range of the system. Also, the threshold LUT may show a dependency of the period on a nature of the data, e.g. a data rate or a number of instructions queued. The thresholds in the threshold LUT may be indicated as absolute values or as percentages of the number of cycles comprised in the period over which the average frequency is obtained. In some embodiments, a functional relationship showing the dependency of the threshold on the at least one of PVT and data is stored. In that sense, a LUT is a special kind of a functional relationship.

In embodiments with a functional relationship for the threshold, the thresholding means 4 checks from time to time and/or upon occurrence of a certain condition such as adaption of the at least one of PVT and data the relevant condition (i.e. the at least one of PVT and data), applies the functional relationship (e.g. selects a corresponding threshold from the threshold LUT), and applies this threshold to the thresholding. If the thresholds are not indicated as absolute values in the threshold LUT, the thresholding means 4 calculates the absolute value from the indicated value.

The thresholding means 4 may additionally take other criteria into account. E.g., it may consider two different periods (a short period and a long period) over which the respective average frequencies are determined. In some embodiments, only if both the short period average frequency and the long period average frequency exceed respective thresholds, it is considered that the threshold is exceeded. In other embodiments, it is considered that the threshold is exceeded if one of the short period frequency and the long period frequency exceeds the respective threshold.

Also, the thresholding means 4 may consider if a certain pattern occurs in the timing violations. The threshold is considered to be exceeded if the certain pattern occurs in addition to the exceeding of the average frequency of occurrence of timing violations.

In some embodiments, the thresholding means 4 may consider that the threshold is exceeded if the average frequency of occurrence of timing violations is larger than a first predefined upper threshold. In some embodiments, the thresholding means 4 may consider that the threshold is not any more exceeded if the average frequency of occurrence of timing violations is less than a second predefined upper threshold. In some embodiments, both the first and second predefined threshold may be applied. In these embodiments, the first and second predefined thresholds may be the same. However, preferably, the second predefined threshold is lower than the first predefined threshold in order to avoid toggling of system parameters by a hysteresis. A corresponding hysteresis may be applied to the lower threshold.

If there are different thresholding means 4 specifically for different latches of the pipeline, each of the thresholding means may apply a different threshold.

If the thresholding means 4 considers that the average frequency of occurrence of timing violations is outside the range it issues an error signal.

The controlling means 5 is described under the assumption that the thresholding means 4 considers that the average frequency of occurrence of timing violations is outside the range if the average frequency of occurrence of timing violations is larger than the upper threshold. If the thresholding means 4 considers that the average frequency of occurrence of timing violations is outside the range if the average frequency of occurrence of timing violations is less than the lower threshold, the operation of the controlling means 5 is inversed to that described hereinafter.

The controlling means 5 may get aware of an error signal from the thresholding means 4 because the thresholding means 4 sends the same to the controlling means, or because the controlling means 5 checks from time to time (e.g. periodically) if there is an error signal at the thresholding means 4. If the controlling means 5 gets aware of the error signal, it controls at least one of the clock control means, processing control means, heat control means, bias control means, current control means, and temperature control unit 6. Since the error signal in this description means that the average frequency of occurrence of timing violations is outside the range, the respective one or more control units may adapt their respective controllable parameter (clock frequency, processing, heat generation, bias voltage, current, local temperature) such that the average frequency of occurrence of timing violations is in the range again. E.g., it may increase or decrease the clock frequency, adapt the processes such that more or less parallel processes are performed simultaneously, and/or increase or decrease the local temperature of a part or the whole of the logic circuit. For this, the controlling means 5 may control the respective control units 6, i.e. clock control unit, processing control unit, heat control unit, bias voltage control unit and temperature control unit.

The control units 6 are conventionally known. For example, the bias voltage may be controlled by a voltage controller such as a DC to DC converter with variable ratio. The local temperature may be controlled by a controller of a heater or a cooler such as a fan or a Peltier element. The clock frequency may be controlled by a controller of a variable frequency oscillator. The processing may be controlled by a scheduler in an operating system.

In some embodiments, the system may comprise a LUT where parameters such as clock frequency, processing, heat generation, bias voltage, current, local temperature are stored in dependence of PVT and for different processes. This LUT may be updated dynamically if a stable processing of a process is achieved (i.e. the average frequency of timing violations is in the range). Thus, the system may preemptively adapt its operating parameters based on the knowledge achieved in previously performing a corresponding process.

In some embodiments, the logic circuit is battery operated via a DC to DC converter with fixed ratio of input and output voltages. If battery charge is decreased, the battery voltage decreases, too. Since the DC to DC converter has a fixed ratio, the supply voltage to the logic circuit decreases, which may result in timing violations. If a high frequency of occurrence of timing violations is detected by the thresholding means 4, the controlling means 5 may reduce the clock frequency (and/or one or both of processes and temperature), such that the frequency of occurrence of timing violations is decreased in spite of the reduced supply voltage. Thus, a system with high total energy efficiency is obtained. That is, this system may still operate even if the battery charge is relatively low. The same mechanism may apply correspondingly if the input voltage to the DC to DC converter is reduced due to other reasons than reduced charge of a battery, e.g. if another load is connected to the input side of the DC to DC converter, regardless of whether the system is battery operated or not.

Each of the means of the system of FIG. 2 may be realized by dedicated hardware or by firmware or software running on a processor. The SW may be embodied on a computer-readable medium or may be directly loadable into a computer.

Typically, at least the timing violation detection means 1 and timing violation correction means 2 are realized by hardware. The timing violation frequency means may be realized as hardware or as software, e.g. as a counter implemented in the operating system (OS) or an application software (higher layer software). Also, each of the thresholding means 4 and the controlling means 5 may be realized by hardware or as firmware or software of the operating system or an application software.

For example, the timing violation detection means 1, timing violation frequency obtaining means 3, thresholding means 4, and controlling means 5 may all be realized by dedicated HW. In this case, the HW of the controlling means has an interface to the at least one of the clock means, process control means, and temperature driving means.

If the timing violation frequency obtaining means 3 is realized by HW (in particular: as a counter), and the thresholding means 4 is realized by SW or FW, there are at least two options for the interface between these means:

In some embodiments, the value of the average frequency of occurrence may be provided by the timing violation frequency obtaining means 3 to the thresholding means 4 in an interrupt request. That is, the value is pushed to the thresholding means 4. The value may be pushed e.g. every time when it is changed. It may also be pushed after a certain number of clock cycles.

In some embodiments, the thresholding means 4 reads from time to time (e.g. periodically) the value of the average frequency of occurrence at the timing violation frequency obtaining means 3. For this, the latter may provide the value in a register. In this case, the value is pulled by the thresholding means 4.

If the thresholding means 4 is realized by HW and the controlling means 5 is realized by SW or FW, corresponding mechanisms may be applied as follows:

In some embodiments, the error signal is provided (pushed) by the thresholding means 4 to the controlling means 5 in an interrupt request. In some embodiments, the controlling means reads (pulls) the error signal from time to time (e.g. periodically) from the thresholding means 5, which may provide the error signal in a register.

FIG. 3 shows an apparatus according to an embodiment of the invention. FIG. 4 shows a method according to an embodiment of the invention. The apparatus according to FIG. 3 may perform the method of FIG. 4 but is not limited to this method. The method of FIG. 4 may be performed by the apparatus of FIG. 3 but is not limited to being performed by this apparatus.

The apparatus comprises thresholding means 10 and controlling means 20.

The thresholding means 10 checks if an average frequency of occurrence of timing violations is within a range (S10). Hence, the thresholding means 10 of FIG. 3 may correspond to the thresholding means 4 of FIG. 2.

If the thresholding means 10 detects that the average frequency of occurrence of timing violations is outside the range ("yes" in step S10), the controlling means 20 controls at least one of the clock frequency, the processing, the heat generation, the bias voltage, the current and the local temperature in a direction to bring the average frequency of occurrence of timing violations back into the range (S20). The controlling means 20 of FIG. 3 may correspond to the controlling means 5 of FIG. 2.

According to some embodiments, the thresholding means 10 receives a value of the average frequency of occurrence of timing violations from outside the apparatus. According to some other embodiments, the apparatus may additionally comprise an obtaining means which obtains a value of an average frequency of occurrence of timing violations and provides it to the thresholding means 10. According to some of these embodiments, it reads the value of the counter from time to time (e.g. periodically). According to some other of these embodiments, it evaluates an IRQ comprising the value of the counter.

In some embodiments, the timing violation frequency obtaining means obtains an absolute number of timing violations instead or in addition to the average frequency of occurrence of timing violations. In these embodiments, the absolute number may replace the average frequency of occurrence of timing violations, or both of these measurement values may be evaluated correspondingly. That is, in some embodiments, an error signal may be triggered by the thresholding means if one of the absolute value and the average occurrence is outside a respective range. In some embodiments, an error signal may be triggered by the thresholding means if both of the absolute value and the average occurrence are outside the respective range.

FIG. 5 shows an apparatus according to an embodiment of the invention. FIG. 6 shows a method according to an embodiment of the invention. The apparatus according to FIG. 5 may perform the method of FIG. 6 but is not limited to this method. The method of FIG. 6 may be performed by the apparatus of FIG. 5 but is not limited to being performed by this apparatus.

The apparatus comprises thresholding means 110 and triggering means 120.

The thresholding means 110 checks if an average frequency of occurrence of timing violations is within a range (S110). Hence, the thresholding means 110 of FIG. 5 may correspond to the thresholding means 4 of FIG. 2.

If the thresholding means 110 detects that the average frequency of occurrence of timing violations is outside the range ("yes" in step S110), the triggering means 120 provides a trigger (S120). For example, in some embodiments, if the thresholding means 110 is realized as hardware, and the controlling means 5 of FIG. 2 is realized as SW or FW, the trigger may be an IRQ. In some embodiments, if the thresholding means 110 is realized as hardware, and the controlling means 5 of FIG. 2 is realized as SW or FW, the trigger may be a status of a register which may be read by the controlling means 5 of FIG. 2.

Figure 7:
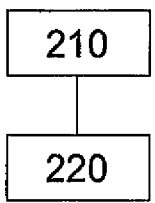
FIG. 7 shows an apparatus according to an embodiment of the invention.
Figure 8:
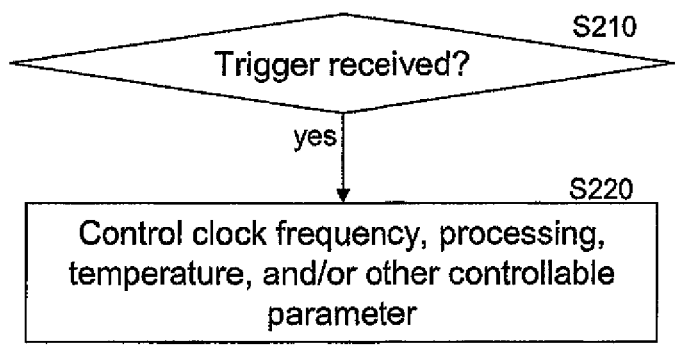
FIG. 8 shows a method according to an embodiment of the invention.

FIG. 7 shows an apparatus according to an embodiment of the invention. FIG. 8 shows a method according to an embodiment of the invention. The apparatus according to FIG. 7 may perform the method of FIG. 8 but is not limited to this method. The method of FIG. 8 may be performed by the apparatus of FIG. 7 but is not limited to being performed by this apparatus.

The apparatus comprises monitoring means 210 and controlling means 220.

The monitoring means 210 monitors if a trigger is received (S210). For example, the trigger may be an IRQ provided by triggering means 120 of FIG. 5.

If the trigger is received ("yes" in step S210), the controlling means 220 controls at least one of the clock frequency, the processing, the heat generation, the bias voltage, the current, and the local temperature in a direction to bring the average frequency of occurrence of timing violations back into the range (S220). The controlling means 220 of FIG. 5 may correspond to the controlling means 5 of FIG. 2.

If not otherwise stated or otherwise made clear from the context, the statement that two entities are different means that they provide different functions. It does not necessarily mean that they are based on different hardware. That is, each of the entities described in the present description may be based on a different hardware, or some or all of the entities may be based on the same hardware.

It is to be understood that what is described above is what is presently considered the preferred embodiments of the present invention. However, it should be noted that the description of the preferred embodiments is given by way of example only and that various modifications may be made without departing from the scope of the invention as defined by the appended claims.

The invention claimed is:

1. A logic circuit apparatus comprising
a logic circuit pipeline adapted to be clocked by a clock frequency, to process a process, and to work at a temperature, wherein the logic pipeline comprises at least two combinational logic units and a corresponding number of registers, wherein each combinational logic unit has at least one input terminal and at least one output terminal, and wherein each of the registers is connected to an output terminal of one of the combinational logic units;
a hardware timing violation detector coupled to the logic pipeline and adapted to detect a timing violation occurring in at least one of the at least two combinational logic units;
a timing violation frequency collector coupled to the timing violation detector and adapted to obtain an average frequency of occurrence of timing violations in the logic pipeline, based on the detection by the timing violation detector;
thresholding detector adapted to check if the average frequency of occurrence of timing violations is outside a range;
a trigger adapted to provide a trigger signal if the average frequency of occurrence of timing violations is outside the range; and
a controller responsive to the trigger and adapted to control at least one of the clock frequency, a processing of the process, heat generation, a bias voltage, a current, and the temperature in a direction to bring the average frequency of occurrence of timing violations into the range if the average frequency of occurrence of timing violations is outside the range;
wherein the timing violation frequency collector is further adapted to adapt a period for obtaining the average timing violation frequency according to a period dependency function based on at least one of the processing, the temperature, a supply voltage and data to be processed.

2. The apparatus according to claim 1 further comprising an obtaining receptor adapted to obtain a value of an average frequency of occurrence of timing violations.

3. The apparatus according to claim 1 wherein
the logic pipeline comprises at least two combinational logics and a corresponding number of registers, wherein each of the registers is connected to an output terminal of one of the combinational logics, and the apparatus further comprises
a timing violation detector adapted to detect a timing violation occurring in at least one of the at least two combinational logics; wherein
the timing violation frequency collector is adapted to obtain the average frequency of occurrence of timing violations based on the detection by the timing violation detector.

4. The apparatus according to claim 1 wherein
the logic pipeline comprises at least two combinational logics and a corresponding number of registers, wherein each of the registers is connected to an output terminal of one of the combinational logics, and the apparatus further comprises
at least two timing violation frequency detectors adapted to obtain the average frequency of occurrence of timing violations separately for each of the at least two combinational logics.

5. The apparatus according to claim 1 wherein
the thresholding detector is further adapted to retrieve the range from a range dependency function based on at least one of the clock frequency, the processing, the heat generation, the bias voltage, the current, the temperature, the supply voltage and data to be processed.

6. The apparatus according to claim 1 wherein at least one of the thresholding detector, trigger, logic pipeline and timing violation frequency collector is implemented as a hardware.

7. A method comprising
   operating a logic circuit pipeline comprising at least two combinational logic units and a corresponding number of registers, wherein each of the registers is connected to an output terminal of one of the combinational logic units, and wherein logic pipeline is clocked by a clock frequency, processes a process, and works at a temperature;
   detecting a timing violation with a hardware timing violation detector occurring in at least one of the two combinational logic units;
   obtaining an average frequency of occurrence of timing violations in the logic pipeline;
   checking if the average frequency of occurrence of timing violations is outside a range;
   providing a trigger if the average frequency of occurrence of timing violations is outside the range;
   controlling, responsive to the trigger, at least one of the clock frequency, the processing, heat generation, a bias voltage, a current, and the temperature in a direction to bring the average frequency of occurrence of timing violations into the range if the average frequency of occurrence of timing violations is outside the range; and
   adapting a period for obtaining the average timing violation frequency according to a period dependency function based on at least one of the processing, the temperature, a supply voltage and data to be processed.

8. A non-transient computer readable medium containing computer program instructions which, when executed on an apparatus, cause the apparatus to:
   obtain an average frequency of occurrence of timing violations in a logic circuit pipeline comprising at least two combinational logic units and a corresponding number of registers, wherein each of the registers is connected to an output terminal of one of the combinational logic units, wherein the logic pipeline is clocked by a clock frequency, processing a process, and working at a temperature;
   detect a timing violation occurring in at least one of the two combinational logics;
   check if the average frequency of occurrence of timing violations is outside a range;
   provide a trigger if the average frequency of occurrence of timing violations is outside the range;
   control, responsive to the trigger, at least one of the clock frequency, the processing, heat generation, a bias voltage, a current, and the temperature in a direction to bring the average frequency of occurrence of timing violations into the range if the average frequency of occurrence of timing violations is outside the range; and
   adapt a period for obtaining the average timing violation frequency according to a period dependency function based on at least one of the processing, the temperature, a supply voltage and data to be processed.

* * * * *